(12) United States Patent
Lee et al.

(10) Patent No.: US 11,605,798 B2
(45) Date of Patent: Mar. 14, 2023

(54) DISPLAY DEVICE INCLUDING CRACK DAM ARRANGEMENT AREA

(71) Applicant: Samsung Display Co., LTD., Yongin-si (KR)

(72) Inventors: Jeong Ho Lee, Asan-si (KR); Sang Hun Lee, Seoul (KR); Za Il Lhee, Hwaseong-si (KR); Min Ju Kim, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/161,513

(22) Filed: Jan. 28, 2021

(65) Prior Publication Data
US 2021/0257591 A1 Aug. 19, 2021

(30) Foreign Application Priority Data

Feb. 13, 2020 (KR) .......................... 10-2020-0017643

(51) Int. Cl.
H01L 51/00 (2006.01)
H01L 51/52 (2006.01)
(Continued)

(52) U.S. Cl.
CPC .............. *H01L 51/5253* (2013.01); *G09G 2300/0408* (2013.01); *G09G 2300/0804* (2013.01);
(Continued)

(58) Field of Classification Search
CPC ............. H01L 51/5253; H01L 51/0096; H01L 51/5246; H01L 51/5256; H01L 2251/5338;
(Continued)

(56) References Cited

U.S. PATENT DOCUMENTS 10,361,395 B2 * 7/2019 Kajiyama ........... H01L 51/5253
11,043,657 B1 * 6/2021 Chen ................... H01L 27/3244
2017/0110532 A1 * 4/2017 Kim ..................... H01L 51/0096
(Continued)

FOREIGN PATENT DOCUMENTS

KR 10-1174884 B1 8/2012
KR 10-2017-0115177 A 10/2017
(Continued)

*Primary Examiner* — Ida M Soward
(74) *Attorney, Agent, or Firm* — Lewis Roca Rothgerber Christie LLP

(57) ABSTRACT

A display device includes: a base substrate including an active area, and a non-active area including a crack dam arrangement area; a plurality of inorganic layers on the base substrate; and an encapsulation layer on the plurality of inorganic layers, and including an encapsulation inorganic layer, and an encapsulation organic layer on the encapsulation inorganic layer. The base substrate includes first substrate portions having a first thickness at the crack dam arrangement area, and a second substrate portion between adjacent ones of the first substrate portions and connected to the first substrate portions, the second substrate portion having a second thickness smaller than the first thickness. The plurality of inorganic layers are laminated to form an inorganic laminated film at the crack dam arrangement area; and the encapsulation inorganic layer is located over the first substrate portions and the second substrate portion, and includes at least one short circuit portion.

20 Claims, 12 Drawing Sheets

(51) Int. Cl.
*H01L 27/14* (2006.01)
*H01L 27/32* (2006.01)
*H01L 27/146* (2006.01)

(52) U.S. Cl.
CPC ...... *H01L 27/14678* (2013.01); *H01L 27/323* (2013.01); *H01L 27/3251* (2013.01); *H01L 2251/301* (2013.01)

(58) Field of Classification Search
CPC ........... H01L 2251/301; H01L 27/3248; H01L 27/3276; H01L 27/3223; H01L 27/3246; H01L 27/3258; H01L 27/3244; H01L 27/323; H01L 27/14678; H01L 27/3251; H01L 27/3297; G09G 2300/0408; G09G 2300/0804
See application file for complete search history.

(56) References Cited

U.S. PATENT DOCUMENTS

| | | | | |
|---|---|---|---|---|
| 2017/0237038 A1* | 8/2017 | Kim | ............ | H01L 51/0096 257/40 |
| 2020/0106046 A1* | 4/2020 | Kim | ............ | H01L 27/326 |
| 2020/0119304 A1* | 4/2020 | Choi | ............ | H01L 51/52 |
| 2020/0144341 A1* | 5/2020 | Choi | ............ | H01L 27/3246 |
| 2020/0161582 A1* | 5/2020 | Choi | ............ | H01L 51/5253 |
| 2020/0174295 A1* | 6/2020 | Baek | ............ | G02F 1/133308 |
| 2020/0176520 A1* | 6/2020 | Kim | ............ | H01L 51/5246 |
| 2020/0176538 A1* | 6/2020 | Um | ............ | H01L 51/5237 |
| 2020/0235333 A1* | 7/2020 | Sung | ............ | H01L 51/5253 |
| 2020/0312933 A1* | 10/2020 | Lee | ............ | H01L 27/3258 |
| 2020/0313101 A1* | 10/2020 | Jung | ............ | H01L 27/3244 |
| 2021/0057674 A1* | 2/2021 | Huang | ............ | H01L 51/5253 |
| 2021/0234122 A1* | 7/2021 | Choi | ............ | H01L 51/56 |
| 2021/0280646 A1* | 9/2021 | Zhang | ............ | H01L 51/5237 |
| 2021/0320276 A1* | 10/2021 | Chang | ............ | H01L 27/3258 |

FOREIGN PATENT DOCUMENTS

| | | |
|---|---|---|
| KR | 10-1889013 B1 | 8/2018 |
| KR | 10-2018-0134802 A | 12/2018 |
| KR | 10-2019-0070424 A | 6/2019 |
| KR | 10-2019-0084192 A | 7/2019 |
| KR | 10-1996436 B1 | 7/2019 |

\* cited by examiner

120: 121, 123
130: 131
140: 141, 143, 145
150: 151, 153, 155

DISPLAY DEVICE INCLUDING CRACK DAM ARRANGEMENT AREA

CROSS-REFERENCE TO RELATED APPLICATION

This application claims priority to and the benefit of Korean Patent Application No 10-2020-0017643, filed on Feb. 13, 2020 in the Korean Intellectual Property Office, the entire disclosure of which is incorporated by reference herein.

BACKGROUND

1. Field

Aspects of one or more example embodiments of the present disclosure relate to a display device.

2. Description of the Related Art

A display device for displaying an image may be used for various electronic appliances for providing an image to a user, for example, such as smart phones, tablet PCs, digital cameras, notebook computers, navigators, televisions, and/or the like. A display device includes a display panel for generating and displaying an image, and various input devices.

As the bezel of the display panel decreases, crack resistance applied from the edge of the display panel may decrease.

The above information disclosed in this Background section is for enhancement of understanding of the background of the present disclosure, and therefore, it may contain information that does not constitute prior art.

SUMMARY

According to one or more example embodiments of the present disclosure, a display device includes: a base substrate including an active area, and a non-active area around the active area, the non-active area including a crack dam arrangement area; a plurality of inorganic layers on the base substrate; and an encapsulation layer on the plurality of inorganic layers, and including an encapsulation inorganic layer, and an encapsulation organic layer on the encapsulation inorganic layer. The base substrate includes first substrate portions having a first thickness at the crack dam arrangement area, and a second substrate portion between adjacent ones of the first substrate portions and connected to the first substrate portions, the second substrate portion having a second thickness smaller than the first thickness. The second substrate portion exposes an upper end of a side surface of the first substrate portions adjacent thereto; the plurality of inorganic layers are laminated to form an inorganic laminated film at the crack dam arrangement area; a plurality of inorganic laminated films are arranged for each of the first substrate portions, and are spaced from each other with the second substrate portion therebetween; a via organic layer is located between the inorganic laminated film and the encapsulation inorganic layer at the crack dam arrangement area; and the encapsulation inorganic layer is located over the first substrate portions and the second substrate portion, and includes at least one short circuit portion.

In an example embodiment, the via organic layer may be located over an upper surface of the inorganic laminated film, a side surface of the inorganic laminated film, an upper end of a side surface of the first substrate portions exposed by the second substrate portion, and an upper surface of the second substrate portion.

In an example embodiment, the via organic layer may be in direct contact with the upper surface of the inorganic laminated film, the side surface of the inorganic laminated film, the upper end of the side surface of the first substrate portion exposed by the second substrate portion, and the upper surface of the second substrate portion.

In an example embodiment, the encapsulation inorganic layer may be on the upper surface of the inorganic laminated film, the side surface of the inorganic laminated film, and the upper surface of the second substrate portion.

In an example embodiment, the encapsulation inorganic layer may include a first encapsulation inorganic layer on the via organic layer, and a second encapsulation inorganic layer on the first encapsulation inorganic layer.

In an example embodiment, a first thickness of the first encapsulation inorganic layer on the upper surface of the inorganic laminated film may be greater than each of a second thickness of the first encapsulation inorganic layer on the side surface of the inorganic laminated film and a third thickness of the first encapsulation inorganic layer on the upper surface of the second substrate portion.

In an example embodiment, the inorganic laminated film may include a barrier layer on the first substrate portions, a buffer layer on the barrier layer, a first gate insulating layer on the buffer layer, a second gate insulating layer on the first gate insulating layer, and an interlayer insulating film on the second gate insulating layer.

In an example embodiment, at the active area, the display device may further include: a first conductive layer between the first gate insulating layer and the second gate insulating layer; a second conductive layer between the second gate insulating layer and the interlayer insulating film; and a third conductive layer on the interlayer insulating film.

In an example embodiment, the active area may include at least one thin film transistor, and the thin film transistor may include a semiconductor layer between the buffer layer and the first gate insulating layer, a gate electrode of the first conductive layer, a first source-drain electrode of the third conductive layer, and a second source-drain electrode of the third conductive layer.

In an example embodiment, at the active area, the display device may further include: a first via layer on the third conductive layer; a fourth conductive layer on the first via layer; and a second via layer on the fourth conductive layer.

In an example embodiment, the second via layer may be at the same layer as that of the via organic layer, and may include the same material as that of the via organic layer.

In an example embodiment, the display device may further include: a metal residual layer between the side surface of the first substrate portion exposed by the second substrate portion and the via organic layer.

In an example embodiment, the metal residual layer may include the same material as that of the fourth conductive layer.

In an example embodiment, the side surface of the inorganic laminated film may protrude from the side surface of the first substrate portion to partially overlap with the second substrate portion in a thickness direction.

In an example embodiment, the end of the encapsulation inorganic layer may be located inward from the end of the base substrate.

In an example embodiment, the encapsulation inorganic layer may extend to the end of the base substrate.

In an example embodiment, the crack dam arrangement area may extend along a periphery of the active area.

According to one or more example embodiments of the present disclosure, a display device includes: a base substrate including an active area, and a non-active area around the active area, the non-active area including a crack dam arrangement area; a plurality of inorganic layers on the base substrate; and an encapsulation layer on the plurality of inorganic layers, and including an encapsulation inorganic layer, and an encapsulation organic layer on the encapsulation inorganic layer. The base substrate includes first substrate portions having a first thickness at the crack dam arrangement area, and a second substrate portion between adjacent one of the first substrate portions and connected to the first substrate portions, the second substrate portion having a second thickness smaller than the first thickness. The second substrate portion exposes an upper end of a side surface of the first substrate portion adjacent thereto; and the second substrate portion includes a first sub-substrate portion and a second sub-substrate portion spaced from each other, and having different widths from each other. The plurality of inorganic layers are laminated to form an inorganic laminated film at the crack dam arrangement area; and a plurality of inorganic laminated films are arranged for each of the first substrate portions, and are spaced from each other with the second substrate portion therebetween. The encapsulation inorganic layer includes the inorganic laminated film, a first encapsulation inorganic layer on the base substrate, and a second encapsulation inorganic layer on the first encapsulation inorganic layer; each of the first encapsulation inorganic layer and the second encapsulation inorganic layer is located over the first substrate portions and the second substrate portion, and includes at least one short circuit portion; and a thickness of the first encapsulation inorganic layer at the first sub-substrate portion is different from a thickness of the first encapsulation inorganic layer at the second sub-substrate portion.

In an example embodiment, the width of the first sub-substrate portion may be greater than the width of the second sub-substrate portion, and the first sub-substrate portion may be located closer to the active area than the second sub-substrate portion.

In an example embodiment, the width of the first sub-substrate portion may be greater than the width of the second sub-substrate portion, and the first sub-substrate portion may be located farther from the active area than the second sub-substrate portion.

However, aspects and features of the present disclosure are not restricted to the ones set forth herein. The above and other aspects and features of the present disclosure will become more apparent to one of ordinary skill in the art to which the present disclosure pertains by referencing the detailed description below.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
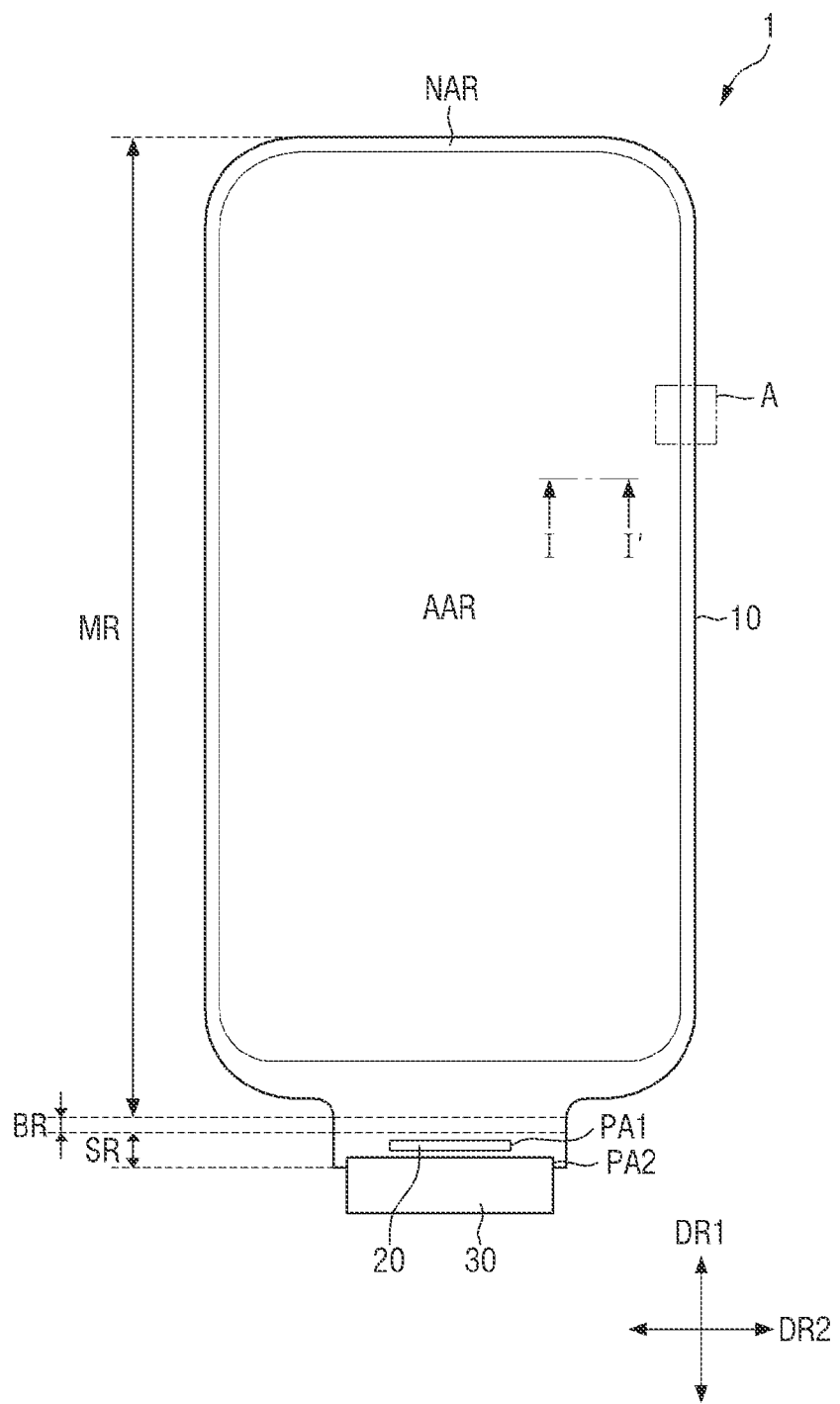
FIG. 1 is a plan view of a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "bottom" "under," "above," "upper," "top," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present. In contrast, it should be understood that when an element is referred to as being related to another element such as being "directly coupled" or "directly connected" to another element, there are no intervening elements present. Other expressions that describe the relationship between elements, such as "between," "directly between," "adjacent to," or "directly adjacent to," should be construed in the same way.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Terms such as "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Example embodiments are described herein with reference to various cross-sectional illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
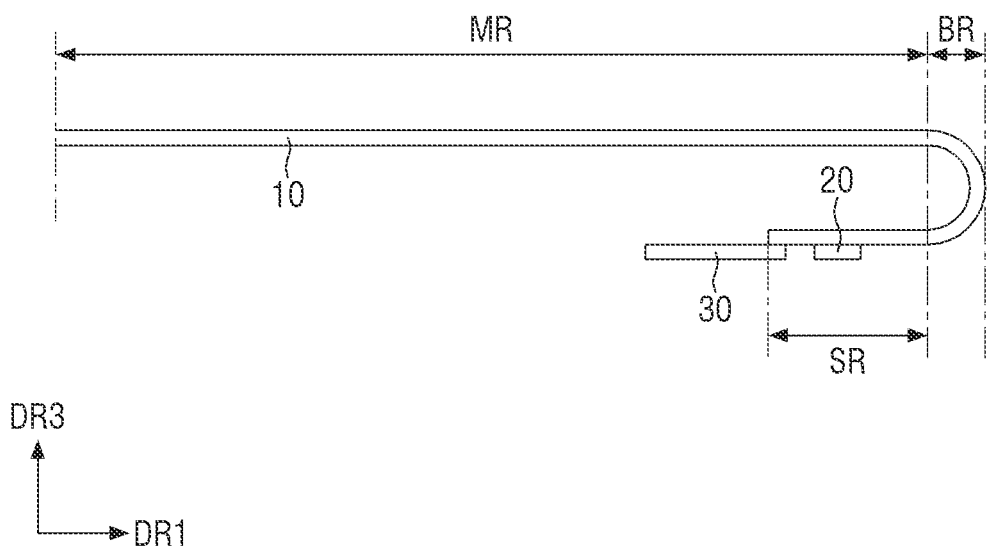
FIG. 2 is a schematic partial cross-sectional view of a display device according to an embodiment.

FIG. 1 is a plan view of a display device according to an embodiment, and FIG. 2 is a schematic cross-sectional view of a display device according to an embodiment.

In embodiments, a first direction DR1 and a second direction DR2 cross each other in different directions. In the plan view of FIG. 1, for convenience of illustration, the first direction DR1 is shown as a vertical direction, and the second direction DR2 is shown as a horizontal direction. As used herein, one side of the first direction DR1 may refer to an upward direction in the plan view, the other side (or another side) of the first direction DR1 may refer to a downward direction in the plan view, one side of the second direction DR2 may refer to a right direction in the plan view, and the other side (or another side) of the second direction DR2 may refer to a left direction in the plan view. However, the present disclosure is not limited thereto, and the directions described with reference to the various example embodiments shown in the figures should be understood to refer to relative directions, and the embodiments are not limited to the aforementioned directions.

Referring to FIGS. 1 and 2, a display device 1 may refer to any suitable electronic device that provides a display screen. Some examples of the display device 10 as implemented in various products include televisions, notebooks, monitors, billboards, internets of things devices, and/or the like, as well as various suitable portable electronic appliances, for example, such as mobile phones, smart phones, tablet personal computers (PCs), smart watches, watch phones, mobile communication terminals, electronic notebooks, electronic books, portable multimedia players (PMPs), navigators, ultra-mobile PCS (UMPs), and/or the like.

The display device 1 includes an active area AAR, and a non-active area NAR. In the display device 1, a portion displaying a screen may be defined as a display area, a portion not displaying a screen may be defined as a non-display area, and an area where a touch input is detected may be defined as a touch area. In this case, the display area and the touch area may be included at (e.g., in or on) the active area AAR. The display area and the touch area may overlap with each other (e.g., in a thickness direction). In other words, the active area AAR may be an area where display is performed (e.g., an area where an image is displayed), as well as an area where a touch input is detected. The shape (e.g., a planar shape or a shape in a plan view) of the active area AAR may be a rectangular shape or a rectangular shape having rounded corners. For example, the shape of the active area AAR may be rectangular having rounded corners and in which a side extending in the first direction DR1 is longer than a side extending in the second direction DR2. However, the present disclosure is not limited thereto, and the active area AAR may have various suitable shapes (e.g., planar shapes or shapes in a plan view), for example, such as a rectangle in which a side extending in the second direction DR2 is longer than a side extending in the first direction DR1, a square, other suitable polygons, a circle, an ellipse, and/or the like.

The non-active area NAR is disposed around (e.g., to surround around a periphery of) the active area AAR. The non-active area NAR may be a bezel area. The non-active area NAR may surround (e.g., around a periphery of) all sides (e.g., four sides in the drawings) of the active area AAR. However, the present disclosure is not limited thereto. For example, the non-active area NAR may not be disposed around the upper side of the active area AAR, and/or around the left and right sides of the active area AAR.

Signal lines and/or driving circuits for applying signals to the active area AAR (e.g., the display area and/or the touch area) may be arranged at (e.g., in or on) the non-active area NAR. The non-active area NAR may not include a display area. Further, the non-active area NAR may not include a touch area. However, the present disclosure is not limited thereto, and in another embodiment, the non-active area NAR may include a part (e.g., a portion) of the touch area, and a sensing member, for example, such as a pressure sensor, may be disposed at (e.g., in or on) the corresponding area. In some embodiments, the active area AAR may be the same or substantially the same (e.g., exactly the same) area as the display area where a screen is displayed (e.g., where an image is displayed), and the non-active area NAR may be the same or substantially the same area as the non-display area where a screen is not displayed (e.g., where an image is not displayed).

The display device 1 includes a display panel 10 that provides a display screen. Examples of the display panel may include an organic light emitting display panel, a micro LED display panel, a nano LED display panel, a quantum dot light emitting display panel, a liquid crystal display panel, a plasma display panel, a field emission display panel, an electrophoretic display panel, and an electrowetting display panel. Hereinafter, for convenience, a case where the organic light emitting display panel is applied as an example of the display panel 10 may be described in more detail. However, the present disclosure is not limited thereto, and the display panel 10 may be applied with any other suitable kinds of display panels.

The display panel 10 may include a plurality of pixels. The plurality of pixels may be arranged in a matrix direction. The shape of each pixel may be a rectangle or a square in a plan view, but the present disclosure is not limited thereto, and each pixel may have a rhombus shape in a plan view in which each side is inclined with respect to the first direction DR1. Each pixel may include a light emitting area. Each light emitting area may have the same or substantially the same shape as that of the pixel, but may have a different shape from that of the pixel. For example, when the pixel has a rectangular shape (e.g., in a plan view), the light emitting area of the corresponding pixel may have various suitable shapes (e.g., in a plan view), for example, such as a rectangle, a rhombus, a hexagon, an octagon, a circle, and/or the like.

The display device 1 may further include a touch member (e.g., a touch panel or a touch layer) that detects a touch input. The touch member may be provided as a panel or a film separate from the display panel 10, and attached to the display panel 10, but the present disclosure is not limited thereto, and the touch member may be provided in the form of a touch layer inside the display panel 10.

The display panel 10 may include a flexible substrate including a flexible polymer material, for example, such as polyimide. Accordingly, the display panel 10 may be bent, warped, folded, rolled, and/or the like.

The display panel 10 may include a bending area BR at (e.g., in) which the display panel 10 is bent. The display panel 10 may be divided into a main area MR located at one side of the bending area BR, and a sub-area SR located at the other side of the bending area BR, based on the bending area BR.

The display area of the display panel 10 is disposed at (e.g., in or on) the main area MR. In an embodiment, edges around (e.g., surrounding a periphery of) the display area at (e.g., in or on) the main area MR, the entire bending area BR, and the entire sub-area SR may be non-display areas. However, the present disclosure is not limited thereto, and the bending area BR and/or the sub-area SR may include a display area.

The main area MR may generally have a shape that is the same or substantially the same as (e.g., similar to) the planar appearance of the display device 1. The main area MR may be a flat area located in one plane. However, the present disclosure is not limited thereto, and at least one of the remaining edges other than the edge (e.g., the side) connected to the bending area BR may be curved at (e.g., in or on) the main area MR to form a curved surface or a bend in the vertical direction.

When at least one of the remaining edges other than the edge (e.g., the side) connected to the bending area BR is curved or bent at (e.g., in or on) the main area MR, the display area may also be disposed at the corresponding edge. However, the present disclosure is not limited thereto, and the curved or bent edge may be a non-display area that does not display the screen, or the display area and the non-display area may be mixed at (e.g., in or on) the corresponding portion.

The bending area BR is connected to one side of the main area MR in the first direction DR1. For example, the bending area BR may be connected to the lower short side of the main area MR. The width of the bending area BR may be smaller than the width (e.g., a short side width) of the main area MR. The connection portion of the main area MR and the bending area BR may have an L-shaped cutting shape.

In the bending area BR, the display panel 10 may be bent with a curvature in a downward direction (e.g., in the thickness direction), for example, in a direction opposite to a display surface. The bending area BR may have a constant or substantially constant radius of curvature, but the present disclosure is not limited thereto, and the bending area BR may have a different radius of curvature for different sections (e.g., for each section). As the display panel 10 is bent at (e.g., in) the bending area BR, a surface of the display panel 10 may be reversed. In other words, one surface (e.g., a portion of the one surface) of the display panel 10 facing upward before being bent at the bending area BR may be changed (e.g., may be bent) to face outward through the bending area BR and then face downward.

The sub-area SR extends from the bending area BR. The sub-area SR may extend in a direction parallel to or substantially parallel to the main area MR after the bending is completed. The sub-area SR may overlap with the main area MR in the thickness direction of the display panel 10. The width (e.g., a width in the second direction DR2) of the sub-area SR may be equal to or substantially equal to the width (e.g., the width in the second direction DR2) of the bending area BR, but the present disclosure is not limited thereto.

As shown in FIG. 1, the sub-area SR may include a first pad area PA1, and a second pad area PA2 that is located farther (e.g., in the first direction DR1) from the bending area BR than the first pad area PA1. A driving chip 20 may be disposed at (e.g., in or on) the first pad area PA1 of the sub-area SR. The driving chip 20 may include an integrated circuit for driving the display panel 10. The integrated circuit may include an integrated circuit for display (e.g., for displaying an image), and/or an integrated circuit for a touch unit (e.g., a touch sensor). The integrated circuit for display and the integrated circuit for the touch unit may be provided as separate chips, and/or may be provided to be integrated with each other into one chip.

The second pad area PA2 of the sub area SR of the display panel 10 may include a plurality of display signal line pads, and a plurality of touch signal line pads. A driving substrate 30 may be connected to the second pad area PA2 of the sub-area SR of the display panel 10. The driving substrate 30 may be a flexible printed circuit board or a film.

Figure 3:
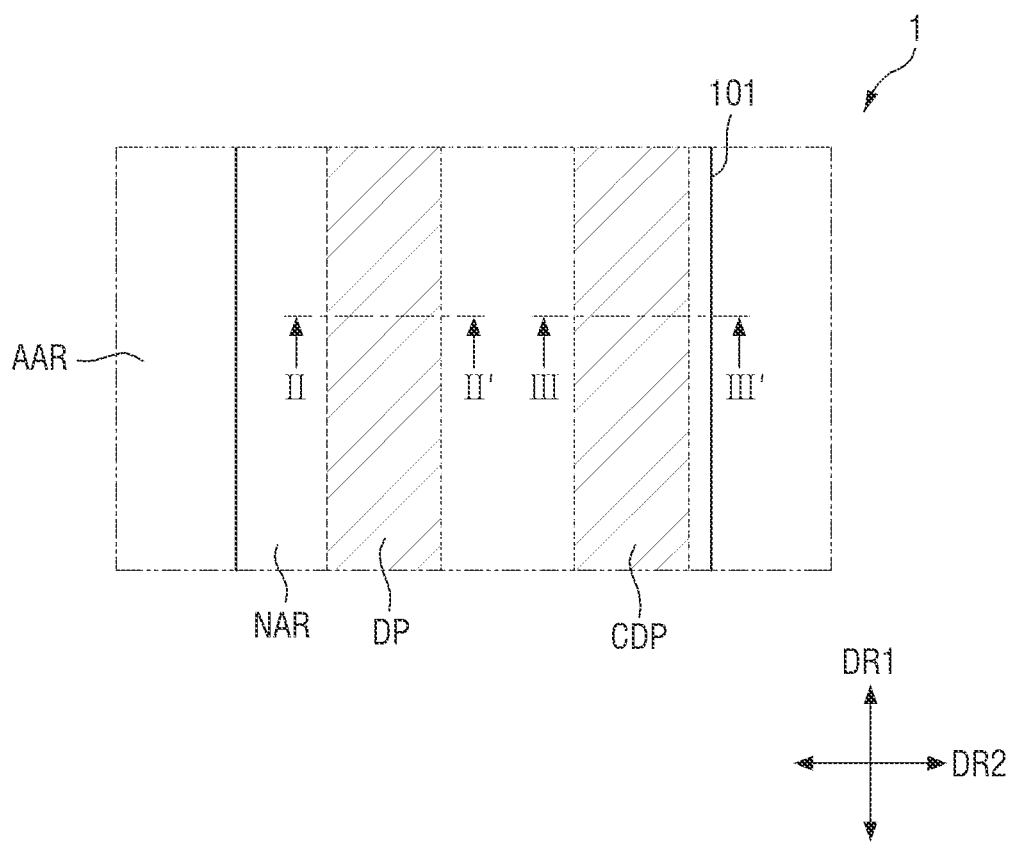
FIG. 3 is a plan view illustrating an active area, and an inactive area including a dam arrangement area and a crack dam arrangement area according to an embodiment.

FIG. 3 is a plan view illustrating an active area, and an inactive area including a dam arrangement area and a crack dam arrangement area according to an embodiment.

Referring to FIG. 3, the non-active area NAR may include a dam arrangement area DP and a crack dam arrangement area CDP. The dam arrangement area DP and the crack dam arrangement area CDP may be disposed around (e.g., to surround around a periphery of) the active area AAR, and may extend along the border of the active area AAR. The dam arrangement area DP may be disposed between the crack dam arrangement area CDP and the active area AAR.

A plurality of dam structures (e.g., see DAM1 and DAM2 in FIG. 5) may be arranged at (e.g., in or on) the dam arrangement area DP, and a plurality of trench grooves (e.g., see TH1, TH2, and TH3 in FIG. 6) may be arranged at (e.g., in or on) the crack dam arrangement area CDP.

Figure 4:
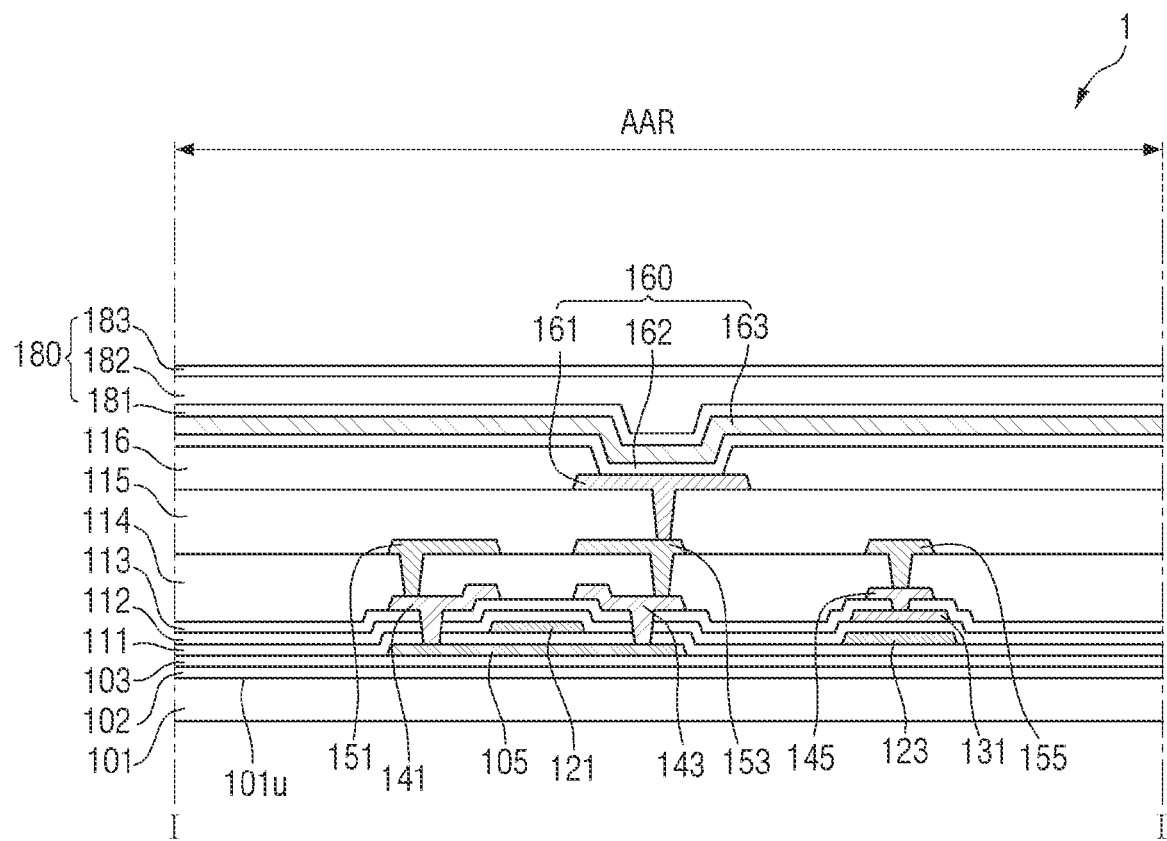
FIG. 4 is a cross-sectional view taken along the line I-I' of FIG. 1.
Figure 5:
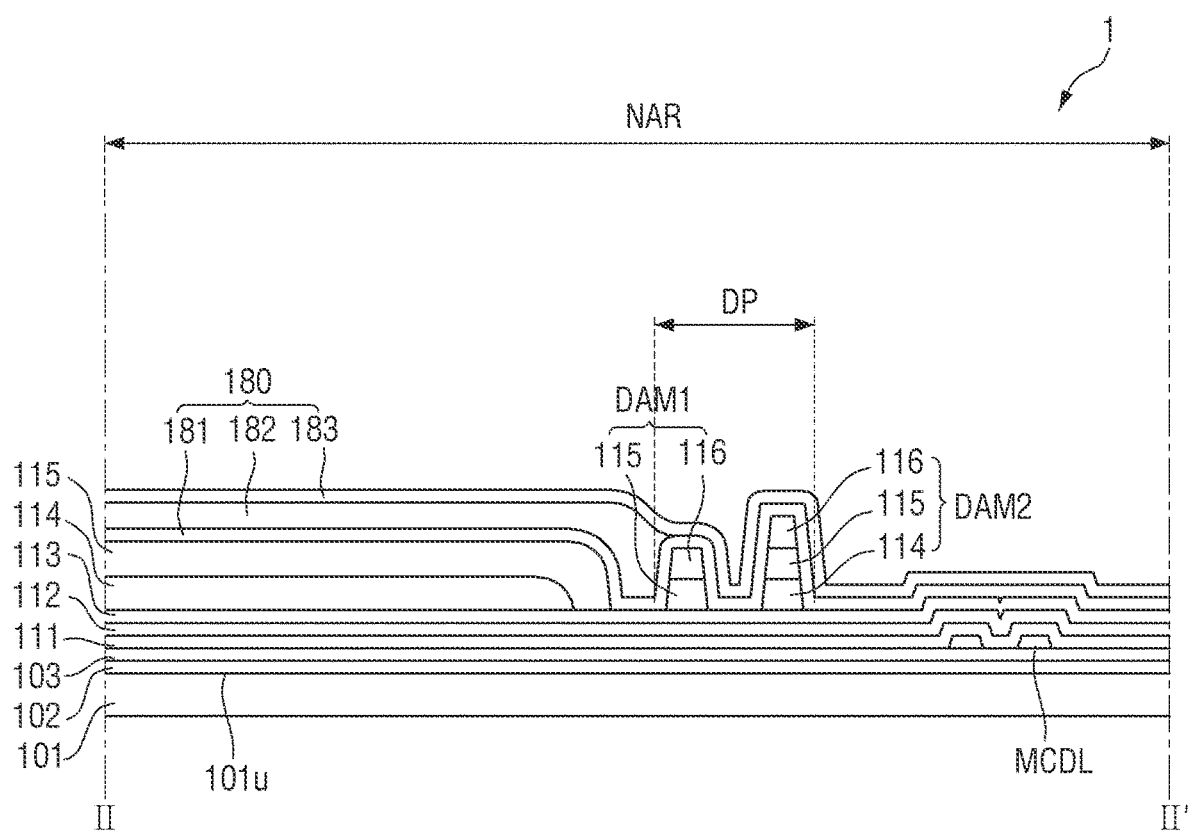
FIG. 5 is a cross-sectional view taken along the line II-II' of FIG. 3.
Figure 6:
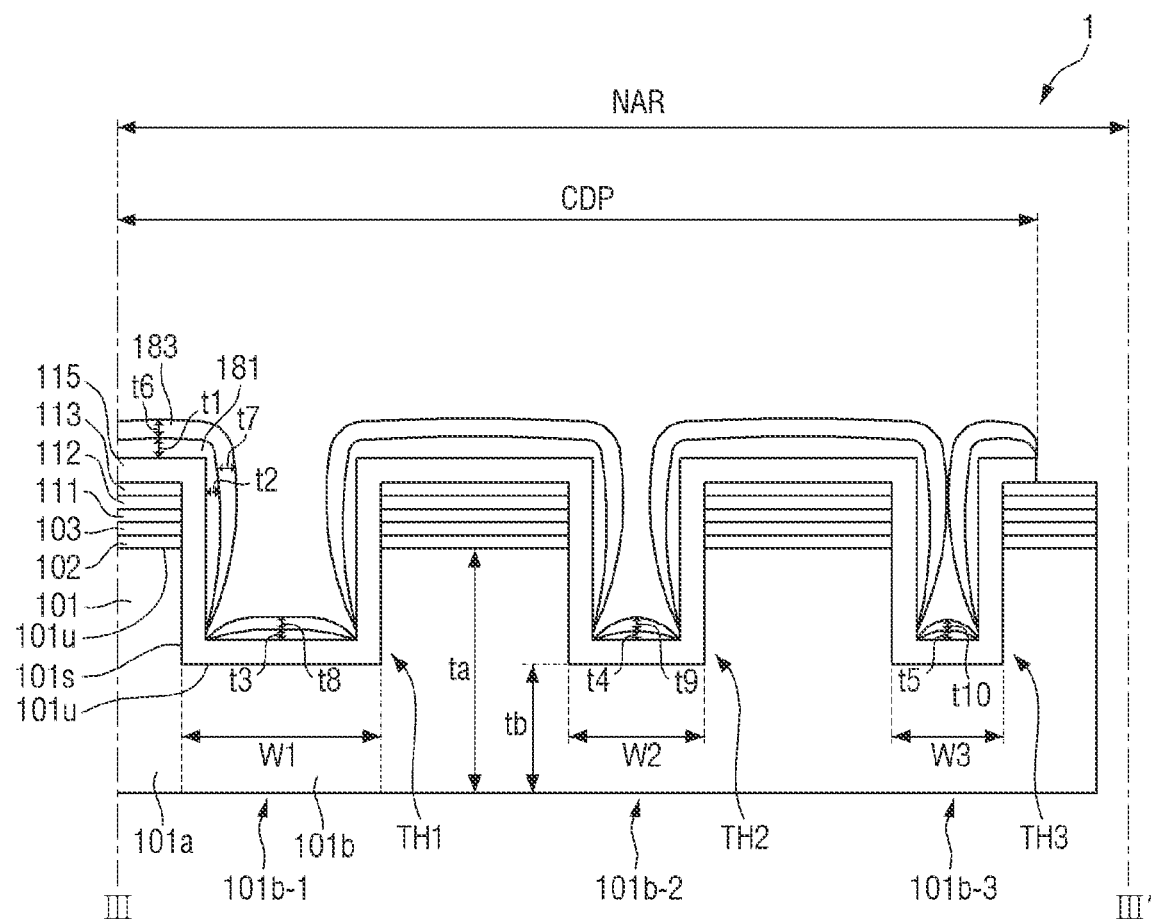
FIG. 6 is a cross-sectional view taken along the line III-III' of FIG. 3.

FIG. 4 is a cross-sectional view taken along the line I-I' of FIG. 1, FIG. 5 is a cross-sectional view taken along the line II-II' of FIG. 3, and FIG. 6 is a cross-sectional view taken along the line III-III' of FIG. 3.

Referring to FIG. 4, the display panel 10 includes a base substrate 101, a plurality of conductive layers disposed on the base substrate 101, a plurality of insulating layers, and an organic light emitting layer.

In more detail, the base substrate 101 may support each layer disposed thereon. The base substrate may be disposed over the active area AAR and the inactive area NAR. The base substrate 101 may be made of an insulating material, for example, such as a polymer resin. Examples of the polymer resin may include, for example, polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations thereof. The base substrate 101 may be a flexible substrate capable of bending, folding, rolling, and/or the like. An example of the material constituting the flexible substrate include, but are not limited to, polyimide (PI). In some embodiments, the base substrate 101 may be a rigid substrate made of, for example, glass, quartz, and/or the like.

The base substrate 101 may include one surface 101u (e.g., an upper surface) facing a barrier layer 102 thereon, and another surface (e.g., a lower surface) opposite to the one surface 101u. The base substrate 101 may be flat or substantially flat at (e.g., in or on) the active area AAR. For example, the one surface 101u of the base substrate 101 may have a linear shape at (e.g., in or on) the active area AAR. The base substrate 101 may be divided into two portions having different thicknesses at (e.g., in or on) the crack dam arrangement area CDP of the non-active area NAR. At (e.g., in or on) the crack dam arrangement area CDP, the base substrate 101 includes a first substrate portion 101a having a first thickness ta, and a second substrate portion 101b having a second thickness tb. The second thickness tb may be smaller than the first thickness ta.

The first substrate portion 101a may have the same or substantially the same thickness as that of the base substrate 101 at (e.g., in or on) the active area AAR. For example, the first substrate portion 101a may be the same or substantially the same as the base substrate 101 at (e.g., in or on) the active area AAR. For example, one surface 101u of the first substrate portion 101a may be located on the same line (e.g., on the same plane) as the one surface 101u of the base substrate 101 at (e.g., in or on) the active area AAR.

One surface 101u of the second substrate portion 101b may be located under (e.g., located lower than) the one surface 101u of the first substrate portion 101a. The second substrate portion 101b may be disposed to be recessed downward from the first substrate portion 101a. The second substrate portion 101b may be physically connected to the first substrate portion 101a. The second substrate portion 101b may be disposed between adjacent first substrate portions 101a in a plan view. The second substrate portion 101b may expose an upper end 101s of the side surface of an adjacent first substrate portion 101a. The space enclosed by the extension line (e.g., the sides) of the one surface 101u of the adjacent first substrate portions 101a, the upper ends 101s of the side surfaces of the adjacent first substrate portions 101a, and the one surface 101u of the second substrate portion 101b may be referred to as a recess pattern. For example, the recess pattern may have a trench shape. The recess pattern may extend along the periphery of the active area AAR. For example, the recess pattern may extend along the crack dam arrangement area CDP.

When cracks formed at an end of the base substrate 101 (for example, an end of one long side surface in the second direction DR2 of FIG. 1) reach the recess pattern, the recess pattern may serve to induce the cracks to be reduced (e.g., to disappear) while moving along the extension direction of the recess pattern.

According to an embodiment, a number of the second substrate portions 101b may be three (e.g., a first sub-substrate portion 101b-1, a second sub-substrate portion 101b-2, and a third sub-substrate portion 101b-3). For example, a number of the recess patterns may be three. For example, the recess pattern may include a first recess pattern TH1, a second recess pattern TH2, and a third recess pattern TH3, which may be successively arranged in order far from the end of the base substrate 101 (e.g., the end of one side surface in the second direction (DR2) of FIG. 1), or may be successively arranged in order close to the active area AAR.

The recess patterns TH1 to TH3 may have widths (e.g., may have predetermined widths) W1 to W3, respectively. For example, the first recess pattern TH1 may have a first width W1, the second recess pattern TH2 may have a second width W2, and the third recess pattern TH3 may have a third width W3. The first width W1 may be greater than each of the second width W2 and the third width W3, and the second width W2 may be greater than the third width W3. For example, the first width W1 may be about 5 micro-meters (um), the second width W2 may be about 4 um, and the third width W3 may be about 3 um.

Generally, the larger the width of the recess pattern, the greater the crack reduction effect (e.g., the crack extinction effect) discussed above. In the display device 1 according to an embodiment, the recess patterns TH1 to TH3 having large widths may be arranged in order close to the active area AAR, thereby sequentially reducing the size of the crack extending towards (e.g., reaching) the active area AAR.

Although it is shown in FIG. 6 that the number of the recess patterns is three, the present disclosure is not limited thereto, and the number of the recess patterns may be one, two, or four or more.

The barrier layer 102 may be disposed on the base substrate 101. The barrier layer 102 may prevent or substantially prevent the diffusion of impurity ions, may prevent or substantially prevent the penetration of moisture and/or external air, and may perform a surface planarization function. The barrier layer 102 may be disposed at (e.g., in or on) the active area AAR and the non-active area NAR. The barrier layer 102 may include silicon nitride, silicon oxide, or silicon oxynitride. At (e.g., in or on) the crack dam arrangement area CDP, the barrier layer 102 may not be disposed to overlap with the second substrate portion 101$b$ in the thickness direction. Although it is shown in the drawings that the barrier layer 102 is formed as a single-layer film, the present disclosure is not limited thereto, and in some embodiments, the barrier layer 102 may be a multi-layered film made of laminated films of different materials.

A buffer layer 103 may be disposed on the barrier layer 102. The buffer layer 103 may prevent or substantially prevent the diffusion of impurity ions, may prevent or substantially prevent the penetration of moisture and/or external air, and may perform a surface planarization function. The buffer layer 103 may be disposed at (e.g., in or on) the active area AAR and the non-active area NAR. The buffer layer 103 may include silicon nitride, silicon oxide, or silicon oxynitride. At (e.g., in or on) the crack dam arrangement area CDP, the buffer layer 103 may not be disposed to overlap with the second substrate portion 101$b$ in the thickness direction.

Side surfaces adjacent to the recess patterns TH1 to TH3 of the barrier layer 102 and the buffer layer 103 may be aligned with each other in the thickness direction.

A semiconductor layer 105 may be disposed on the buffer layer 103. The semiconductor layer 105 may form a channel of a thin film transistor. The semiconductor layer 105 is disposed at (e.g., in or on) each pixel of the active area AAR, and in some embodiments, may also be disposed at (e.g., in or on) the non-active area NAR.

The semiconductor layer 105 may include a source/drain region and an active region. The semiconductor layer 105 may include polycrystalline silicon. Polycrystalline silicon may be formed by crystallizing amorphous silicon. In another embodiment, the semiconductor layer 105 may include monocrystalline silicon, low-temperature polycrystalline silicon, amorphous silicon, or an oxide semiconductor.

A first gate insulating layer 111 may be disposed on the semiconductor layer 105. The first gate insulating layer 111 may be disposed at (e.g., in or on) the active area AAR and the non-active area NAR. The first gate insulating layer 111 may include silicon nitride, silicon oxide, or silicon oxynitride. At (e.g., in or on) the crack dam arrangement area CDP, the first gate insulating layer 111 may not be disposed to overlap with the second substrate portion 101$b$ in the thickness direction.

A first conductive layer 120 may be disposed on the first gate insulating layer 111. In an embodiment, the first conductive layer 120 may include a gate electrode 121 of the thin film transistor, and a first electrode 123 of a storage capacitor.

The gate electrode 121 of the thin film transistor and the first electrode 123 of the storage capacitor may be formed of the same or substantially the same material as each other under the same or substantially the same process. For example, the first conductive layer 120 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), Chromium (Cr), calcium (Ca), titanium (Ti), tantalum (Ta), tungsten (W), and copper (Cu). Although it is shown in the drawings that the first conductive layer 120 is formed as a single-layer film, in some embodiments, the first conductive layer 120 may be formed as a multi-layered film. In this case, the multi-layered film of the first conductive layer 120 may be formed as a laminated film of different metals from among the above-described metals.

The first conductive layer 120 may further include a crack detection line MCDL disposed at (e.g., in or on) the non-active area NAR. The crack detection line MCDL may be formed of the same or substantially the same material as that of the gate electrode 121 under the same or substantially the same process.

A second gate insulating layer 112 may be disposed on the first conductive layer 120. The second gate insulating layer 112 may be disposed at (e.g., in or on) the active area AAR and the non-active area NAR. The second gate insulating layer 112 may include silicon nitride, silicon oxide, or silicon oxynitride. At (e.g., in or on) the crack dam arrangement area CDP, the second gate insulating layer 112 may not be disposed to overlap with the second substrate portion 101$b$ in the thickness direction.

The second gate insulating layer 112 may insulate the first conductive layer 120 and a second conductive layer 130.

The second conductive layer 130 may be disposed on the second gate insulating layer 112. The second conductive layer 130 may include a second electrode 131 of the storage capacitor. The second electrode 131 of the storage capacitor may overlap with the first electrode 123 with the second gate insulating layer 112 therebetween. In this case, the first electrode 123 and the second electrode 131 may form the storage capacitor using the second gate insulating layer 112 as a dielectric film.

The first conductive layer 130 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), Chromium (Cr), calcium (Ca), titanium (Ti), tantalum (Ta), tungsten (W), and copper (Cu). In an embodiment, the second conductive layer 130 may be made of the same or substantially the same material as that of the above-described first conductive layer 120.

Although it is shown in the drawings that the second conductive layer 130 is formed as a single-layer film, in some embodiments, the second conductive layer may be formed as a multi-layered film.

An interlayer insulating film 113 is disposed on the second conductive layer 130. The interlayer insulating film 113 may insulate the second conductive layer 130 and a third conductive layer 140.

The interlayer insulating film 113 may be disposed at (e.g., in or on) the active area AAR and the non-active area NAR. The interlayer insulating film 113 may include silicon nitride, silicon oxide, or silicon oxynitride. At (e.g., in or on) the crack dam arrangement area CDP, the interlayer insulating film 113 may not be disposed to overlap with the second substrate portion 101b in the thickness direction.

The third conductive layer 140 may be disposed on the interlayer insulating film 113. In an embodiment, the third conductive layer 140 may include a first source/drain electrode 141 and a second source/drain electrode 143 of the thin film transistor, and a power voltage electrode 145. The first source/drain electrode 141 and second source/drain electrode 143 of the thin film transistor, and the power voltage electrode 145 may be electrically connected to the source region and drain region of the semiconductor layer 105 through a contact hole penetrating (e.g., extending through) the interlayer insulating film 113, the second gate insulating layer 112, and the first gate insulating layer 111.

The third conductive layer 140 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), Chromium (Cr), calcium (Ca), titanium (Ti), tantalum (Ta), tungsten (W), and copper (Cu). As shown in the drawings, the third conductive layer 140 may be formed as a single-layer film. However, the present disclosure is not limited thereto, and the third conductive layer 140 may be formed as a multi-layered film. For example, the third conductive layer 140 may be formed to have a laminated structure of Ti/Al/Ti, Mo/Al/Mo, Mo/AlGe/Mo, or Ti/Cu.

A first via layer 114 may be disposed on the third conductive layer 140. The first via layer 114 may include an organic insulating layer, for example, such as polyacrylate resin, epoxy resin, phenolic resin, polyamide resin, polyimide resin, unsaturated polyester resin, polyphenylene ether resin, polyphenylene sulfide resin, or benzocyclobutene (BCB).

The first via layer 114 may be disposed at (e.g., in or on) the active area AAR and the nonactive area NAR. The first via layer 114 may be disposed from the boundary between the active area AAR and the non-active area NAR to the dam arrangement area DP (e.g., a side surface of the first via layer 114 and the dam arrangement area DP may be spaced apart from each other) at (e.g., in or on) the non-active area NAR, and may be disposed at (e.g., in or on) the dam arrangement area DP. For example, the first via layer 114 may form a part (e.g., a portion) of the second dam DAM2 at (e.g., in or on) the dam arrangement area DP. The first via layer 114 constituting a part (e.g., a portion) of the second dam DAM2 may be directly disposed on the interlayer insulating film 113.

A fourth conductive layer 150 may be disposed on the first via layer 114. The fourth conductive layer 150 may include a data signal line 151, a connection electrode 153, and a power voltage line 155. The data signal line 151 may be electrically connected to the first source/drain electrode 141 of the thin film transistor through a contact hole penetrating (e.g., extending through) the first via layer 114. The connection electrode 153 may be electrically connected to the second source/drain electrode 143 of the thin film transistor through a contact hole penetrating (e.g., extending through) the first via layer 114. The power voltage line 155 may be electrically connected to the power voltage electrode 145 through a contact hole penetrating (e.g., extending through) the first via layer 114.

The fourth conductive layer 150 may include at least one metal selected from among molybdenum (Mo), aluminum (Al), platinum (Pt), palladium (Pd), silver (Ag), magnesium (Mg), gold (Au), nickel (Ni), neodymium (Nd), iridium (Ir), Chromium (Cr), calcium (Ca), titanium (Ti), tantalum (Ta), tungsten (W), and copper (Cu). The fourth conductive layer 150 may be formed as a single-layer film, but the present disclosure is not limited thereto, and the fourth conductive layer 150 may be formed as a multi-layered film. For example, the fourth conductive layer 150 may be formed to have a laminated structure of Ti/Al/Ti, Mo/Al/Mo, Mo/AlGe/Mo, or Ti/Cu.

A second via layer 115 may be disposed on the fourth conductive layer 150. The second via layer 115 may include an organic insulating layer, for example, such as polyacrylate resin, epoxy resin, phenolic resin, polyamide resin, polyimide resin, unsaturated polyester resin, polyphenylene ether resin, polyphenylene sulfide resin, or benzocyclobutene (BCB).

The second via layer 115 may be disposed from the boundary between the active area AAR and the non-active area NAR to the dam arrangement area DP (e.g., a side surface of the second via layer 115 and the dam arrangement area DP may be spaced apart from each other) at (e.g., in or on) the non-active area NAR. The second via layer 115 disposed from the boundary between the active area AAR and the non-active area NAR to the dam arrangement area DP (e.g., the side surface of the second via layer 115 and the dam arrangement area DP may be spaced apart from each other) may cover the side surface of the first via layer 114. The second via layer 115 may be further disposed at (e.g., in or on) the dam arrangement area DP. For example, the second via layer 115 may constitute a part (e.g., a portion) of the first dam DAM1, and a part (e.g., a portion) of the second dam DAM2 at (e.g., in or on) the dam arrangement area DP. The second via layer 115 constituting a part (e.g., a portion) of the first dam DAM1 may be directly disposed on the interlayer insulating film 113, and the second via layer 115 constituting a part (e.g., a portion) of the second dam DAM2 may be directly disposed on the first via layer 114.

The second via layer 115 may be further disposed at (e.g., in or on) the crack dam arrangement area CDP.

The barrier layer 102, the buffer layer 103, the gate insulating layers 111 and 112, and the interlayer insulating film 113, which are disposed at (e.g., in or on) the first substrate portion 101a of the crack dam arrangement area CDP, may be sequentially laminated in an upward direction. At (e.g., in or on) the first substrate portion 101a of the crack dam arrangement area CDP, the barrier layer 102, the buffer layer 103, the gate insulating layers 111 and 112, and the interlayer insulating film 113, which are sequentially laminated in an upward direction, may be referred to as an inorganic laminate film. The inorganic laminated film in which the first substrate portions 101a adjacent to the second substrate portion 101b are located may be disposed to be spaced apart from the second substrate portion 101b.

A side surface of the inorganic laminated film may be aligned with the upper end 101s of the side surface of the lower first substrate portion 101a in the thickness direction. The inorganic laminated film may not be disposed to overlap with the second substrate portion 101b in the thickness direction.

The second via layer 115 (e.g., a via organic layer) disposed at (e.g., in or on) the crack dam arrangement area CDP may be disposed between the inorganic laminated film and a first encapsulation inorganic layer 181 on the first substrate portion 101a, may be disposed between the side surface of the inorganic laminated film and the first encapsulation inorganic layer 181 on the side surface of the inorganic laminated film, and may be disposed between the one surface 101u of the second substrate portion 101b and the first encapsulation inorganic layer 181 on the second substrate portion 101b. The second via layer 115 disposed at (e.g., in or on) the crack dam arrangement area CDP may be directly interposed between the inorganic laminated film and the first encapsulation inorganic layer 181 on the first substrate portion 101a, may be directly interposed between the side surface of the inorganic laminated film and the first encapsulation inorganic layer 181 on the side surface of the inorganic laminated film, and may be directly interposed between the one surface 101u of the second substrate portion 102b and the first encapsulation inorganic layer 181 on the second substrate portion 101b. As used herein, the term "directly interposed" means that the corresponding interposed component is in direct contact with adjacent components.

The second via layer 115 (e.g., the via organic layer) disposed at (e.g., in or on) the crack dam arrangement area CDP may be continuously disposed.

An anode electrode 161 is disposed on the second via layer 115. The anode electrode 161 may be connected to the connection electrode 153 through a contact hole passing (e.g., extending) through the second via layer 115, and may be electrically connected to the second source/drain electrode 143 of the thin film transistor through the contact hole.

A pixel defining layer 116 may be disposed on the anode electrode 161. The pixel defining layer 116 may include an opening exposing the anode electrode 161. The pixel defining layer 116 may be made of an organic insulating material or an inorganic insulating material. In an embodiment, the pixel defining layer 116 may include a material, for example, such as photoresist, polyimide resin, acrylic resin, silicone compound, or polyacrylic resin.

The pixel defining layer 116 may be further disposed at (e.g., in or on) the dam arrangement area DP. For example, the pixel defining layer 116 may constitute a part (e.g., a portion) of the first dam DAM1, and a part (e.g., a portion) of the second dam DAM2 at (e.g., in or on) the dam arrangement area DP. The pixel defining layer 116 constituting a part (e.g., a portion) of the first dam DAM1 may be directly disposed on the second via layer 115, and the pixel defining layer 116 constituting a part (e.g., a portion) of the second dam DAM2 may be directly disposed on the second via layer 115.

An organic layer 162 may be disposed on an upper surface of the anode electrode 161, and at (e.g., in or on) the opening of the pixel defining layer 116. The organic layer 162 may be disposed to extend from the opening of the pixel defining layer 116 to an upper surface of the pixel defining layer 116. However, the present disclosure is not limited thereto, and in some embodiments, the organic layer 162 may be disposed only at (e.g., in or on) the opening of the pixel defining layer 116. The organic layer 162 may include an organic light emitting layer, a hole injection/transport layer, and an electron injection/transport layer. A cathode electrode 163 is disposed on the organic layer 162 and the pixel defining layer 116. The cathode electrode 163 may be a common electrode disposed over a plurality of pixels. The anode electrode 161, the organic layer 162, and the cathode electrode 163 may constitute a glass light emitting element 160.

A thin film encapsulation layer 180 is disposed on the organic layer 162. The thin film encapsulation layer 180 may cover the organic light emitting element 160. The thin film encapsulation layer 180 may include at least one inorganic layer and at least one organic layer. The at least one inorganic layer and the at least one organic layer may be alternately arranged. For example, the thin film encapsulation layer 180 may include the first encapsulation inorganic layer 181, an encapsulation organic layer 182, and a second encapsulation inorganic layer 183, which are sequentially laminated.

At (e.g., in or on) the thin film encapsulation layer 180, the first encapsulation inorganic layer 181, the encapsulation organic layer 182, and the second encapsulation inorganic layer 183, which are sequentially laminated, may be disposed at (e.g., in or on) the active area AAR and the non-active area NAR.

The encapsulation organic layer 182 may be disposed at (e.g., in or on) the non-active area NAR, from the boundary between the active area AAR and the non-active area NAR to the first dam DAM1, and may not be disposed outside the first dam DAM1. For example, the encapsulation organic layer 182 may be disposed on the side surface of the first dam DAM1 and a part (e.g., a portion) of the upper surface thereof.

The encapsulation inorganic layers 181 and 183 may surround the encapsulation organic layer 182 disposed on the side surface of the first dam DAM1 and a part (e.g., a portion) of the upper surface thereof. For example, the encapsulation inorganic layers 181 and 183 may be spaced apart from each other with the encapsulation organic layer 182 therebetween up to the side surface of the first dam DAM1 and a part (e.g., a portion) of the upper surface thereof, but may be in direct contact with each other from another part of the upper surface of the first dam DAM1 to the outside. The encapsulation inorganic layers 181 and 183 may be further disposed at (e.g., in or on) the dam arrangement area DP and the crack dam arrangement area CDP. The encapsulation inorganic layers 181 and 183 may be continuously disposed from the active area AAR to the crack dam arrangement area CDP. The encapsulating inorganic layers 181 and 183 may not be disposed between the crack dam arrangement area CDP and the end of the base substrate 101, and may expose the upper surface of the inorganic laminated film.

At (e.g., in or on) the crack dam arrangement area CDP, the encapsulating inorganic layers 181 and 183 may include at least one short circuit portion for each layer.

A surface height of a lower structure of the second via layer 115 on the first substrate portion 101a may be greater than a surface height of the lower structure of the second via layer 115 on the second substrate portion 101b (for example, a step structure may be formed between the lower structure of the second via layer 115 on the first substrate portion 101a and the lower structure of the second via layer 115 on the second substrate portion 101b). The surface height of the lower structure of the second via layer 115 on the first substrate portion 101a may be equal to or substantially equal to a sum of the height ta-tb of the first substrate portion 101a protruding upward from the second substrate portion 101b and the thickness of the inorganic laminated film. The surface height of the lower structure of the second via layer 115 on the first substrate portion 101a may be greater than the surface height of the lower structure of the second via layer 115 on the second substrate portion 101b, thereby inducing the short-circuiting in the formation of the encapsulation inorganic layers 181 and 183.

In more detail, the encapsulating inorganic layers 181 and 183 may be disposed on the upper surface of the inorganic laminated film, the side surface of the inorganic laminated film, the upper end 101s of the exposed side surface of the first substrate portion 101a, and the upper surface 101u of the second substrate portion 101b. In this case, at the time of film formation, due to the step structure between the lower structure of the second via layer 115 on the first substrate portion 101a and the lower structure of the second via layer 115 on the second substrate portion 101b, a short circuit portion (e.g., a disconnected portion) may be formed between the encapsulation inorganic layers 181 and 183 on the upper surface 101u of the second substrate portion 101b and the encapsulation inorganic layer 181 and 183 on the upper end 101s of the exposed side surface of the first substrate portion 101a for each layer, as illustrated in FIG. 6. The position of the short circuit portion illustrated in FIG. 6 is exemplary, and the present disclosure is not limited thereto.

The encapsulation inorganic layers 181 and 183 may have different thicknesses for each position.

For example, the first encapsulation inorganic layer 181 on the upper surface of the inorganic laminated film may have a first thickness t1, the first encapsulation inorganic layer 181 on the side surface of the inorganic laminated film may have a second thickness t2, and the first encapsulation inorganic layer 181 on the upper surface 101u of the second substrate portion 101b forming the first recess pattern TH1 may have a third thickness t3. The first thickness t1 may be greater than each of the second thickness t2 and the third thickness t3. Thus, when forming a film on the first recess pattern TH1 and therearound using a first encapsulation inorganic material, due to the step structure between the lower structure of the second via layer 115 on the first substrate portion 101a and the lower structure of the second via layer 115 on the second substrate portion 101b, the first encapsulation inorganic material may be formed (e.g., may be easily formed) into a film on the lower structure of the second via layer 115 on the first substrate portion 101a, whereas the first encapsulation inorganic material may not be easily formed into a film on the second substrate portion 101b or the upper end 101s of the exposed side surface of the first substrate portion 101a.

In more detail, the thickness of the first encapsulation inorganic layer 181 on the second substrate portion 101b or the upper end 101s of the exposed side surface of the first substrate portion 101a may be changed depending on the width of the recess pattern. For example, the thickness of the first encapsulation inorganic layer 181 on the second substrate portion 101b or the upper end 101s of the exposed side surface of the first substrate portion 101a may increase as the width of the recess pattern increases. For example, the third thickness t3 of the first encapsulation inorganic layer 181 of the first recess pattern TH1 may be greater than each of a fourth thickness t4 of the first encapsulation inorganic layer 181 of the second recess pattern TH2 and a fifth thickness t5 of the first encapsulation inorganic layer 181 of the third recess pattern TH3. The reason for this is that the first encapsulation inorganic material may not be easily formed into a film on the second substrate portion 101b as the width of the recess pattern decreases.

The second encapsulation inorganic layer 183 on the upper surface of the inorganic laminated film may have a sixth thickness t6, the second encapsulation inorganic layer 183 on the side surface of the inorganic laminated film may have a seventh thickness t7, and the second encapsulation inorganic layer 183 on the upper surface 101u of the second substrate portion 101b forming the first recess pattern TH1 may have an eighth thickness t8. The sixth thickness t6 may be greater than each of the seventh thickness t7 and the eighth thickness t8. Thus, when forming a film on the first recess pattern TH1 and therearound using a second encapsulation inorganic material, due to the step structure between the lower structure of the second via layer 115 on the first substrate portion 101a and the lower structure of the second via layer 115 on the second substrate portion 101b, the second encapsulation inorganic material may be formed (e.g., may be easily formed) into a film on the lower structure of the second via layer 115 on the first substrate portion 101a, whereas the second encapsulation inorganic material may not be easily formed into a film on the second substrate portion 101b or the upper end 101s of the exposed side surface of the first substrate portion 101a.

In more detail, the thickness of the second encapsulation inorganic layer 183 on the second substrate portion 101b or the upper end 101s of the exposed side surface of the first substrate portion 101a may be changed depending on the width of the recess pattern. For example, the thickness of the second encapsulation inorganic layer 183 on the second substrate portion 101b or the upper end 101s of the exposed side surface of the first substrate portion 101a may increase as the width of the recess pattern increases. For example, the eighth thickness t8 of the second encapsulation inorganic layer 183 of the first recess pattern TH1 may be greater than each of a ninth thickness t9 of the second encapsulation inorganic layer 183 of the second recess pattern TH2 and a tenth thickness t10 of the second encapsulation inorganic layer 183 of the third recess pattern TH3. The reason for this is that the second encapsulation inorganic material may not be easily formed into a film on the second substrate portion 101b as the width of the recess pattern decreases.

Figure 7:
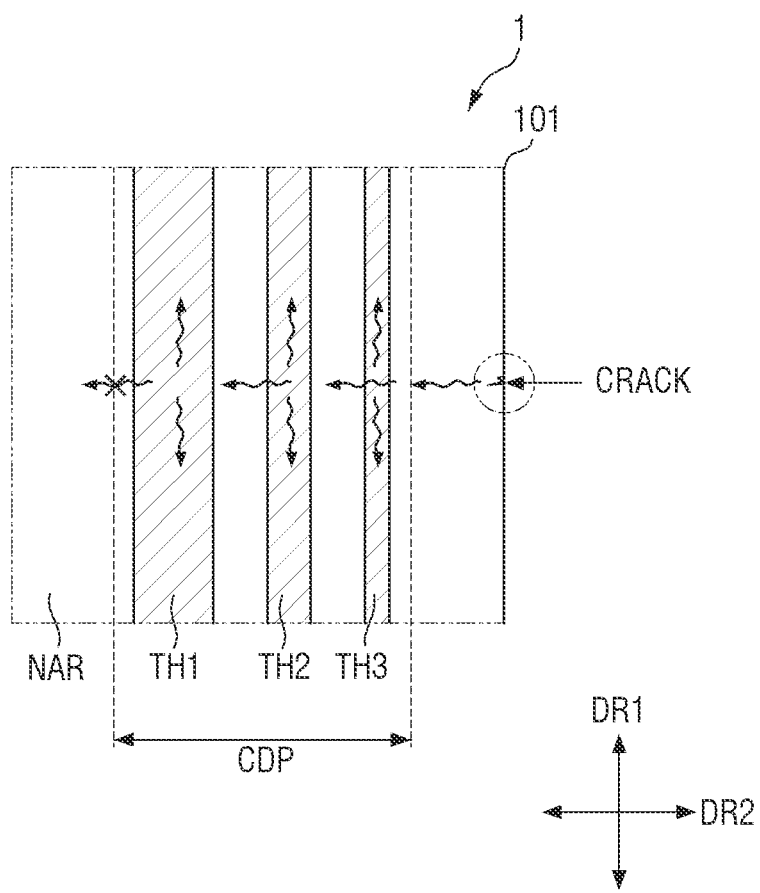
FIG. 7 is a schematic cross-sectional view illustrating a planar shape of a plurality of trench grooves in the crack dam arrangement area, and illustrating a case of inhibiting the propagation of cracks applied from the edge of a display panel.

FIG. 7 is a schematic cross-sectional view illustrating a planar shape of a plurality of trench grooves in the crack dam arrangement area, and illustrating a case of inhibiting the propagation of cracks applied from the edge of a display panel.

Referring to FIG. 7 together with FIG. 6, cracks CRACK may be applied from an end of the display panel (e.g., see 10 in FIG. 1). The cracks CRACK may propagate to the active area AAR through the encapsulation inorganic layers 181 and 183 located adjacent to (e.g., near) the end of the display panel 10. As the area (for example, a bezel area) of the non-active area NAR becomes smaller, it may not be easy to form a separate crack dam for preventing or substantially preventing the cracks CRACK from propagating to the active area AAR. However, in the display device 1 according to one or more embodiments, even if a crack dam is not formed in a separate space, the base substrate 101 includes the recess pattern so that, when cracks CRACK generated at the end of the base substrate 101 reaches the recess pattern, the recess pattern may induce the cracks CRACK to be reduced or to disappear along the extension direction of the recess pattern. Thus, it may be possible to prevent or substantially prevent the cracks CRACK from propagating to the active area AAR. Further, the surface height of the lower structure of the second via layer 115 on the first substrate portion 101a may be greater than the surface height of the lower structure of the second via layer 115 on the second substrate portion 101b, thereby inducing the short-circuiting in the formation of the encapsulation inorganic layers 181 and 183. Thus, it may be possible to prevent or substantially prevent the crack applied from the end of the display panel 10 from propagating to the active area AAR through the encapsulation inorganic layers 181 and 183 located adjacent to (e.g., near) the end of the display panel 10.

Figure 8:
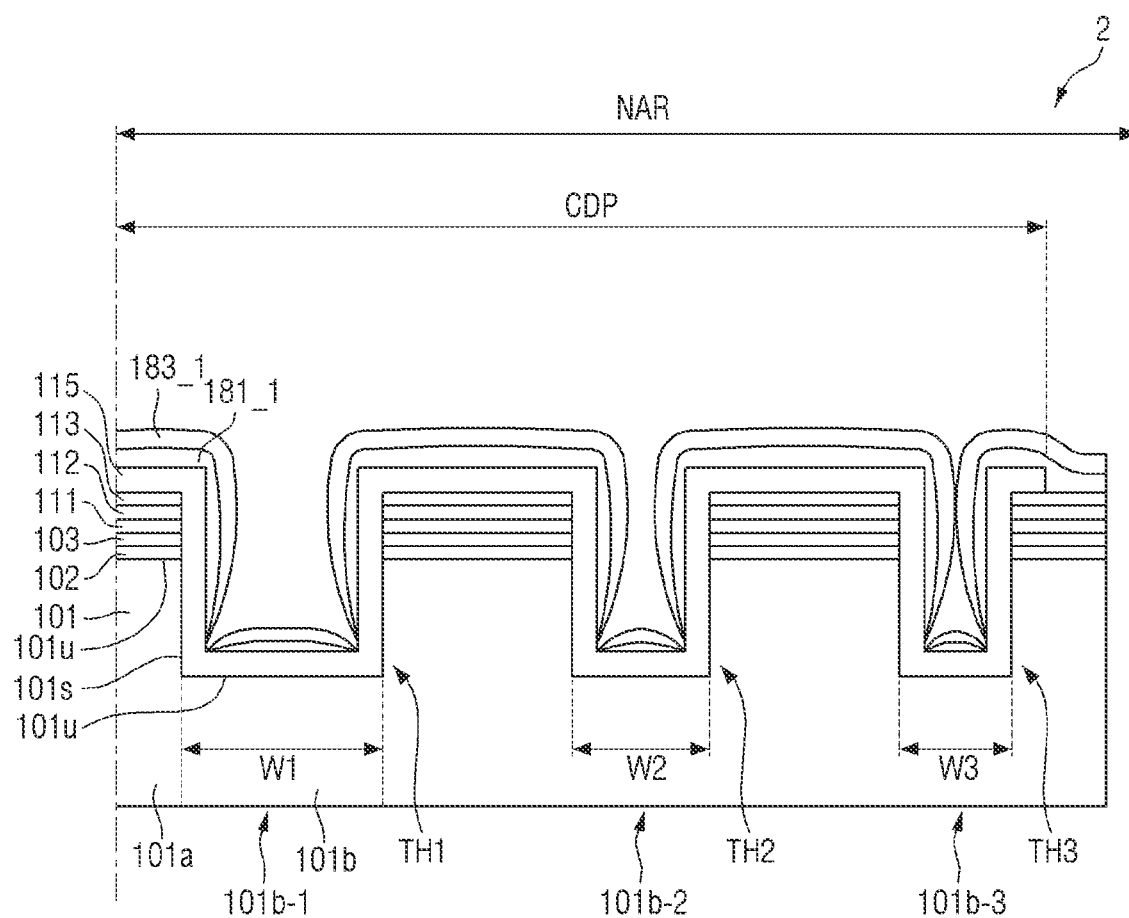
FIG. 8 is a cross-sectional view of a display device according to another embodiment.

FIG. 8 is a cross-sectional view of a display device according to another embodiment.

Referring to FIG. 8, a display device 2 according to the present embodiment may be different from the display device 1 of FIG. 6 in that encapsulation inorganic layers 181_1 and 183_1 may extend to the end of the base substrate 101.

In more detail, in the display device 2 according to the present embodiment, the encapsulation inorganic layers 181_1 and 183_1 may extend to the end of the base substrate 101.

Even in this embodiment, cracks CRACK may be applied from the end of the display panel (e.g., see 10 in FIG. 1). The cracks CRACK may propagate to the active area AAR through the encapsulation inorganic layers 181_1 and 183_1 located adjacent to (e.g., near) the end of the display panel 10. As the area (for example, a bezel area) of the non-active area NAR becomes smaller, it may not be easy to form a separate crack dam for preventing the cracks from propagating to the active area AAR. However, in the display device 2 according to the present embodiment, even if a crack dam is not formed in a separate space, the base substrate 101 includes the recess pattern so that, when cracks CRACK generated at the end of the base substrate 101 reaches the recess pattern, the recess pattern may induce the cracks to disappear or to be reduced along the extension direction of the recess pattern. Thus, it may be possible to prevent or substantially prevent the cracks CRACK from propagating to the active area AAR. Further, the surface height of the lower structure of the second via layer 115 on the first substrate portion 101a may be greater than the surface height of the lower structure of the second via layer 115 on the second substrate portion 101b, thereby inducing the short-circuiting in the formation of the encapsulation inorganic layers 181_1 and 183_1. Thus, it may be possible to prevent or substantially prevent the crack CRACK applied from the end of the display panel 10 from propagating to the active area AAR through the encapsulation inorganic layers 181_1 and 183_1 located adjacent to (e.g., near) the end of the display panel 10.

Figure 9:
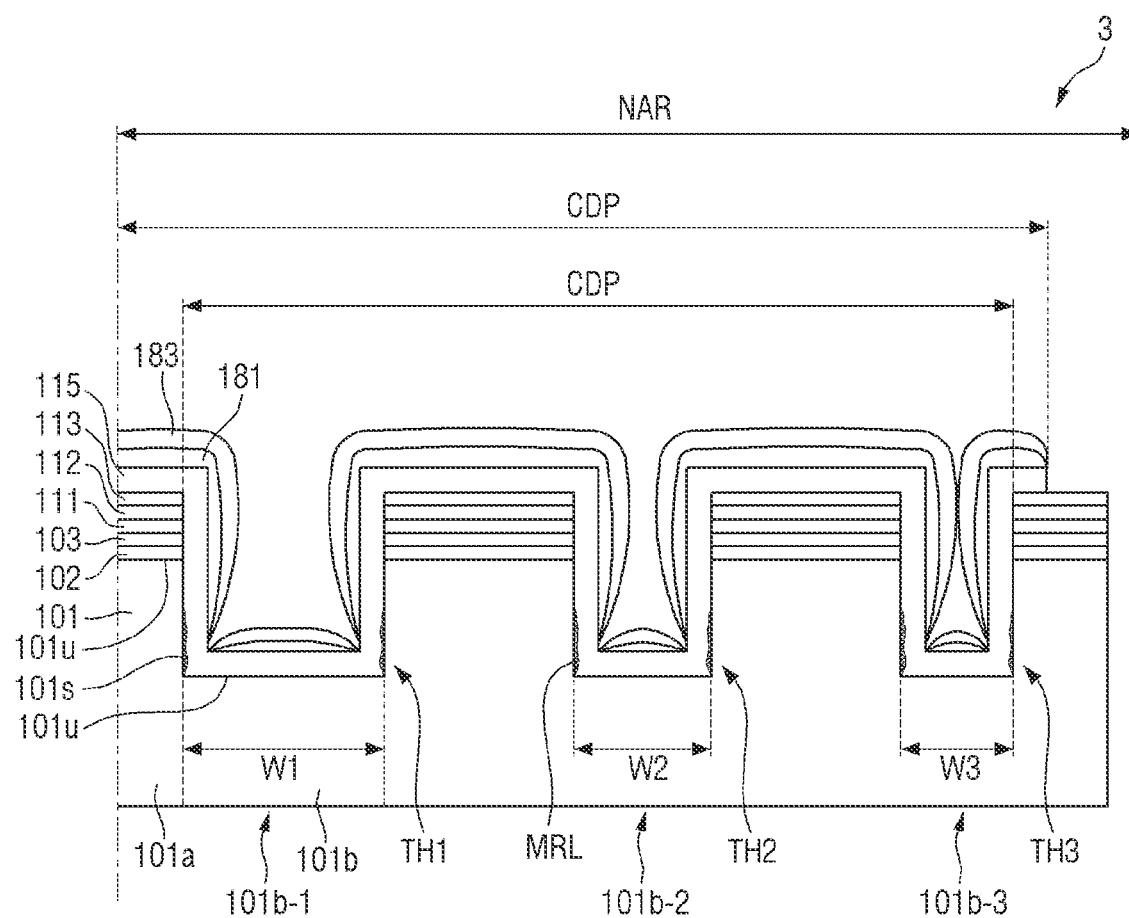
FIG. 9 is a cross-sectional view of a display device according to another embodiment.

FIG. 9 is a cross-sectional view of a display device according to another embodiment.

Referring to FIG. 9, a display device 3 according to the present embodiment may be different from the display device 1 of FIG. 6 in that a metal residual layer MRL may be further provided on the inorganic laminated film and between the upper end 101s of the side surface of the first substrate portion 101a exposed by the second substrate portion 102b and the second via layer 115.

In more detail, in the display device 3 according to the present embodiment, a metal residual layer MRL may further be provided on the inorganic laminated film and between the upper end 101s of the side surface of the first substrate portion 101a exposed by the second substrate portion 102b and the second via layer 115.

The metal residual layer MRL according to the present embodiment may partially remain due to the step structure between the lower structure of the second via layer 115 on the first substrate portion 101a and the lower structure of the second via layer 115 on the second substrate portion 101b when the fourth conductive layer 150 described above with reference to FIG. 4 is entirely deposited and etched. The metal residual layer MRL may include the same or substantially the same material as the material of the fourth conductive layer 150, and may be formed through the same or substantially the same process as the fourth conductive layer 150.

The metal residual layer MRL may be directly disposed on the inorganic laminated film and between the upper end 101s of the side surface of the first substrate portion 101a exposed by the second substrate portion 102b and the second via layer 115.

When an anode electrode material is entirely deposited, the metal residual layer MRL may react with the anode electrode material. Thus, corrosion of the anode electrode material may occur. However, according to the present embodiment, because the second via layer 115 covers the metal residual layer MRL, the corrosion of the anode electrode material by the metal residual layer MRL may be prevented or substantially prevented.

Figure 10:
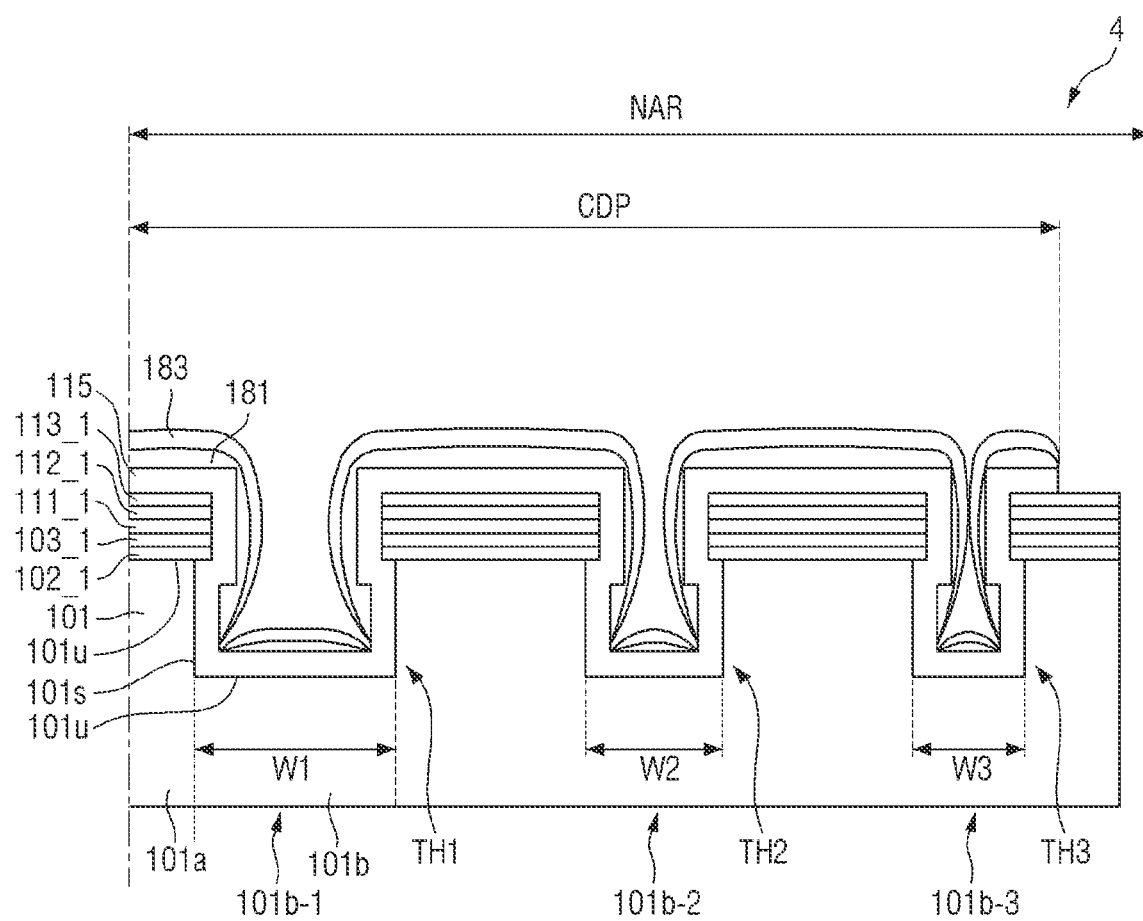
FIG. 10 is a cross-sectional view of a display device according to another embodiment.

FIG. 10 is a cross-sectional view of a display device according to another embodiment.

Referring to FIG. 10, a display device 4 according to the present embodiment may be different from the display device 1 of FIG. 6 in that the side surface of the inorganic laminated film protrudes from the side surface of the first substrate portion 101a.

In more detail, in the display device 4 according to the present embodiment, the side surfaces of the inorganic laminated films 102_1, 103_1, 111_1, 112_1, and 113_1 may protrude from the side surface of the first substrate portion 101a. This is because when the inorganic laminated film is formed by etching, not only the underlying second substrate portion 101b but also the adjacent first substrate portion 101a may be over-etched. The side surfaces of the layers 102_1, 103_1, 111_1, 112_1, and 113_1 constituting the inorganic laminated film may be aligned with each other in the thickness direction.

The inorganic laminated films 102_1, 103_1, 111_1, 112_1, and 113_1 may partially overlap with the second substrate portion 101b in the thickness direction.

Figure 11:
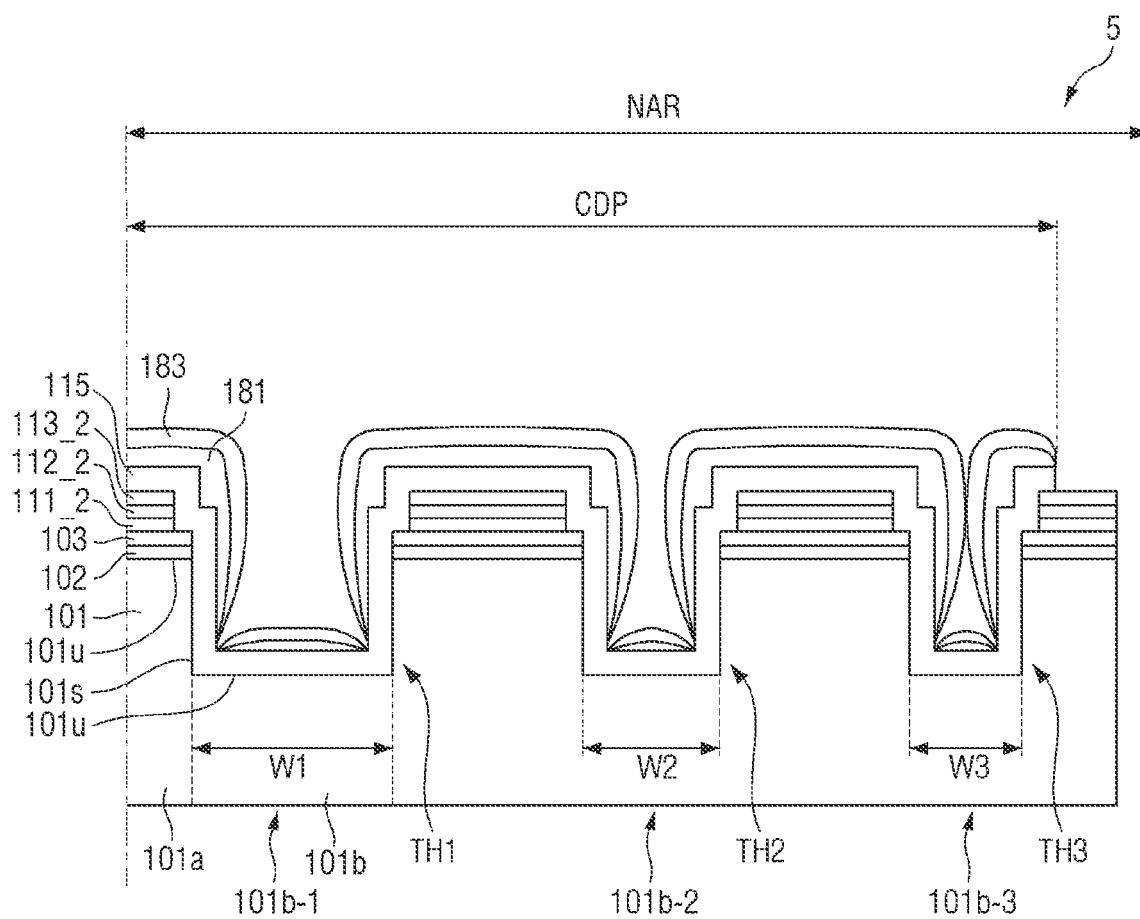
FIG. 11 is a cross-sectional view of a display device according to another embodiment.

FIG. 11 is a cross-sectional view of a display device according to another embodiment.

Referring to FIG. 11, a display device 5 according to the present embodiment may be different from the display device 1 of FIG. 6 in that the side surfaces of gate insulating layers 111_2 and 112_2 and an interlayer insulating film 113_2 of the inorganic laminated film may be located inwards from the side surfaces of the barrier layer 102 and the buffer layer 103.

In more detail, in the display device 5 according to the present embodiment, the side surfaces of gate insulating layers 111_2 and 112_2 and the interlayer insulating film 113_2 of the inorganic laminated film may be located inward from the side surfaces of the barrier layer 102 and the buffer layer 103. The upper surface of the buffer layer 103 may be exposed by the gate insulating layers 111_2 and 112_2 and the interlayer insulating film 113_2.

According to the present embodiment, the side surfaces of the gate insulating layers 111_2 and 112_2 and the interlayer insulating film 113_2 of the inorganic laminated film may be located inward from the side surfaces of the barrier layer 102 and the buffer layer 103, thereby forming a step due to the gate insulating layers 111_2 and 112_2 and the interlayer insulating film 113_2. The step due to the gate insulating layers 111_2 and 112_2 and the interlayer insulating film 113_2 may induce the short-circuiting in the formation of the encapsulation inorganic layers 181 and 183. Thus, it may be possible to prevent or substantially prevent the crack CRACK applied from the end of the display panel 10 from propagating to the active area AAR through the encapsulation inorganic layers 181 and 183 located adjacent to (e.g., near) the end of the display panel 10.

Figure 12:
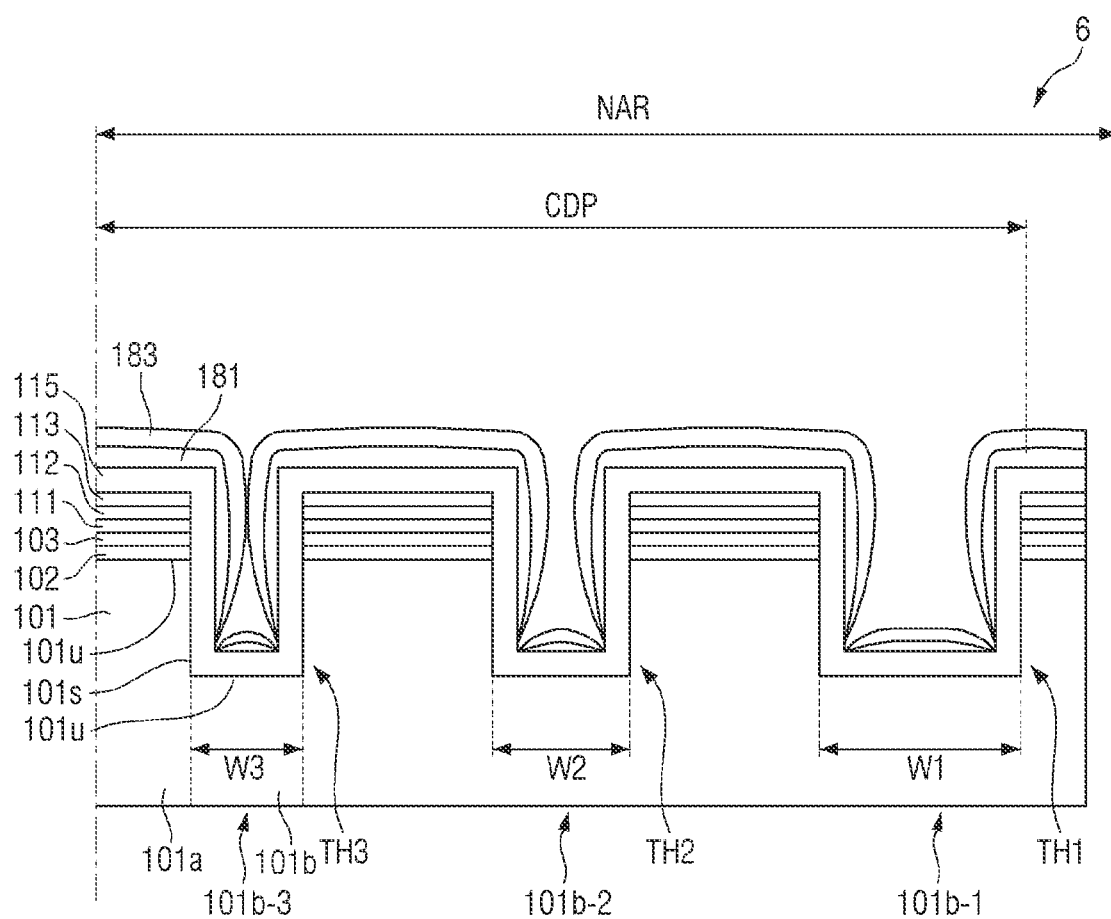
FIG. 12 is a cross-sectional view of a display device according to another embodiment.

FIG. 12 is a cross-sectional view of a display device according to another embodiment.

Referring to FIG. 12, a display device 6 according to the present embodiment may be different from the display device 1 of FIG. 6 in that the recess pattern includes a third recess pattern TH3, a second recess pattern TH2, and a first recess pattern TH1, which may be successively arranged in order far from the end of the base substrate 101 (e.g., the end of one long side in the second direction DR2 of FIG. 1), or may be successively arranged in order close to the active area AAR.

In the display device 6 according to the present embodiment, the recess patterns TH1 to TH3 having a larger width may be arranged farther from the active area AAR, thereby preventing or substantially preventing the cracks CRACK from reaching the active area AAR.

According to one or more example embodiments of the present disclosure, a display device may have improved resistance to cracks applied from the edge of a display panel.

The aspects and features of the present disclosure are not limited by the foregoing, and other various aspects and features are anticipated herein.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

What is claimed is:

1. A display device, comprising:
    a base substrate comprising an active area, and a non-active area around the active area, the non-active area comprising a crack dam arrangement area;
    a plurality of inorganic layers on the base substrate; and
    an encapsulation layer on the plurality of inorganic layers, and comprising an encapsulation inorganic layer, and an encapsulation organic layer on the encapsulation inorganic layer,
    wherein:
        the base substrate comprises first substrate portions having a first thickness at the crack dam arrangement area, and a second substrate portion between adjacent ones of the first substrate portions and connected to the first substrate portions, the second substrate portion having a second thickness smaller than the first thickness;
        the second substrate portion exposes an upper end of a side surface of the first substrate portions adjacent thereto;
        the plurality of inorganic layers are laminated to form an inorganic laminated film at the crack dam arrangement area;
        a plurality of inorganic laminated films are arranged for each of the first substrate portions, and are spaced from each other with the second substrate portion therebetween;
        a via organic layer is located between the inorganic laminated film and the encapsulation inorganic layer at the crack dam arrangement area; and
        the encapsulation inorganic layer is located over the first substrate portions and the second substrate portion, and comprises at least one disconnected portion.

2. The display device of claim 1,
    wherein the via organic layer is located over an upper surface of the inorganic laminated film, a side surface of the inorganic laminated film, the upper end of the side surface of the first substrate portions exposed by the second substrate portion, and an upper surface of the second substrate portion.

3. The display device of claim 2,
    wherein the via organic layer is in direct contact with the upper surface of the inorganic laminated film, the side surface of the inorganic laminated film, the upper end of the side surface of the first substrate portions exposed by the second substrate portion, and the upper surface of the second substrate portion.

4. The display device of claim 2,
    wherein the encapsulation inorganic layer is on the upper surface of the inorganic laminated film, the side surface of the inorganic laminated film, and the upper surface of the second substrate portion.

5. The display device of claim 4,
    wherein the encapsulation inorganic layer comprises a first encapsulation inorganic layer on the via organic layer, and a second encapsulation inorganic layer on the first encapsulation inorganic layer.

6. The display device of claim 5,
    wherein a first thickness of the first encapsulation inorganic layer on the upper surface of the inorganic laminated film is greater than each of a second thickness of the first encapsulation inorganic layer on the side surface of the inorganic laminated film and a third thickness of the first encapsulation inorganic layer on the upper surface of the second substrate portion.

7. The display device of claim 5,
    wherein the inorganic laminated film comprises a barrier layer on the first substrate portions, a buffer layer on the barrier layer, a first gate insulating layer on the buffer layer, a second gate insulating layer on the first gate insulating layer, and an interlayer insulating film on the second gate insulating layer.

8. The display device of claim 7, wherein at the active area, the display device further comprises:
    a first conductive layer between the first gate insulating layer and the second gate insulating layer;
    a second conductive layer between the second gate insulating layer and the interlayer insulating film; and
    a third conductive layer on the interlayer insulating film.

9. The display device of claim 8,
    wherein the active area comprises at least one thin film transistor, and
    the thin film transistor comprises a semiconductor layer between the buffer layer and the first gate insulating layer, a gate electrode of the first conductive layer, a first source-drain electrode of the third conductive layer, and a second source-drain electrode of the third conductive layer.

10. The display device of claim 8, wherein at the active area, the display device further comprises:
    a first via layer on the third conductive layer;
    a fourth conductive layer on the first via layer; and
    a second via layer on the fourth conductive layer.

11. The display device of claim 10,
wherein the second via layer is at the same layer as that of the via organic layer, and comprises the same material as that of the via organic layer.

12. The display device of claim 10, further comprising:
a metal residual layer between the side surface of the first substrate portion exposed by the second substrate portion and the via organic layer.

13. The display device of claim 12,
wherein the metal residual layer comprises the same material as that of the fourth conductive layer.

14. The display device of claim 4,
wherein the side surface of the inorganic laminated film protrudes from the side surface of the first substrate portion to partially overlap with the second substrate portion in a thickness direction.

15. The display device of claim 4,
wherein an end of the encapsulation inorganic layer is located inward from an end of the base substrate.

16. The display device of claim 4,
wherein the encapsulation inorganic layer extends to an end of the base substrate.

17. The display device of claim 4,
wherein the crack dam arrangement area extends along a periphery of the active area.

18. A display device, comprising:
a base substrate comprising an active area, and a non-active area around the active area, the non-active area comprising a crack dam arrangement area;
a plurality of inorganic layers on the base substrate; and
an encapsulation layer on the plurality of inorganic layers, and comprising an encapsulation inorganic layer, and an encapsulation organic layer on the encapsulation inorganic layer,
wherein:
the base substrate comprises first substrate portions having a first thickness at the crack dam arrangement area, and a second substrate portion between adjacent ones of the first substrate portions and connected to the first substrate portions, the second substrate portion having a second thickness smaller than the first thickness;
the second substrate portion exposes an upper end of a side surface of the first substrate portion adjacent thereto;
the second substrate portion comprises a first sub-substrate portion and a second sub-substrate portion spaced from each other, and having different widths from each other;
the plurality of inorganic layers are laminated to form an inorganic laminated film at the crack dam arrangement area;
a plurality of inorganic laminated films are arranged for each of the first substrate portions, and are spaced from each other with the second substrate portion therebetween;
the encapsulation inorganic layer comprises the inorganic laminated film, a first encapsulation inorganic layer on the base substrate, and a second encapsulation inorganic layer on the first encapsulation inorganic layer;
each of the first encapsulation inorganic layer and the second encapsulation inorganic layer is located over the first substrate portions and the second substrate portion, and comprises at least one disconnected portion; and
a thickness of the first encapsulation inorganic layer at the first sub-substrate portion is different from a thickness of the first encapsulation inorganic layer at the second sub-substrate portion.

19. The display device of claim 18,
wherein the width of the first sub-substrate portion is greater than the width of the second sub-substrate portion, and
the first sub-substrate portion is located closer to the active area than the second sub-substrate portion.

20. The display device of claim 18,
wherein the width of the first sub-substrate portion is greater than the width of the second sub-substrate portion, and
the first sub-substrate portion is located farther from the active area than the second sub-substrate portion.

* * * * *